United States Patent
Lee et al.

(10) Patent No.: US 9,660,625 B1
(45) Date of Patent: May 23, 2017

(54) CONTINUOUSLY TUNABLE DELAY LINE

(71) Applicant: International Business Machines Corporation, Armonk, NY (US)

(72) Inventors: Wooram Lee, Braircliff Manor, NY (US); Alberto Valdes Garcia, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/145,173

(22) Filed: May 3, 2016

(51) Int. Cl.
*H03K 5/14* (2014.01)
*H03F 1/02* (2006.01)
*H03K 5/00* (2006.01)

(52) U.S. Cl.
CPC ............ *H03K 5/14* (2013.01); *H03F 1/0277* (2013.01); *H03K 2005/00019* (2013.01)

(58) Field of Classification Search
CPC .................. H03K 5/14; H03K 2005/00019
USPC ................ 327/261, 276, 277, 283, 284, 290
See application file for complete search history.

(56) References Cited

U.S. PATENT DOCUMENTS

| | | | |
|---|---|---|---|
| 4,091,342 A * | 5/1978 | Whitten .................. | H03C 3/00 327/277 |
| 4,340,872 A | 7/1982 | Alter | |
| 4,866,647 A | 9/1989 | Farrow | |
| 5,146,192 A * | 9/1992 | Kondo ................ | H03H 11/265 327/493 |
| 5,357,224 A | 10/1994 | Sterzer | |

FOREIGN PATENT DOCUMENTS

| | | |
|---|---|---|
| JP | 55156433 A | 12/1980 |
| JP | 58212210 A | 12/1983 |
| JP | 03052311 A | 3/1991 |
| KR | 101101050 B1 | 12/2011 |

OTHER PUBLICATIONS

Larocca et al., "Millimeter-Wave CMOS Digital Controlled Artificial Dielectric Differential Mode Transmission Lines for Reconfigurable ICs", Department of Electrical Engineering, University of California, Los Angeles, CA, 90095, USA, © 2008 IEEE, 4 pages.

Roderick et al., "Silicon-Based Ultra-Wideband Beam-Forming", IEEE Journal of Solid-State Circuits, vol. 41, No. 8, Aug. 2006, © 2006 IEEE, 14 pages.

Hoods et al., "CMOS Millimeter Wave Phase Shifter Based on Tunable Transmission Lines", © 2013, IEEE, 4 pages.

* cited by examiner

*Primary Examiner* — William Hernandez
(74) *Attorney, Agent, or Firm* — Steven F. McDaniel

(57) ABSTRACT

An apparatus includes a first conductive path comprising a first set of inductive elements connected in series, a second conductive path comprising a second set of inductive elements connected in series, each inductive element of the second set of inductive elements inductively coupled to, and having a mutual capacitance with, a corresponding inductive element of the first set of inductive elements. In some embodiments, the apparatus further includes a first amplifier having an amplifier input and an amplifier output, the amplifier output electrically connected to a proximal end of the first conductive path or the second conductive path. The described apparatus delays a signal according to the gain of the input amplifier. A method that uses the described apparatus is also disclosed herein.

19 Claims, 6 Drawing Sheets

Delay per stage $\approx \sqrt{L_{eff} C_{eff}} = \sqrt{(1+G)(1+kG)} \sqrt{LC}$ $$Z_0 \approx \sqrt{\frac{(1+kG)L}{(1+G)C}}$$

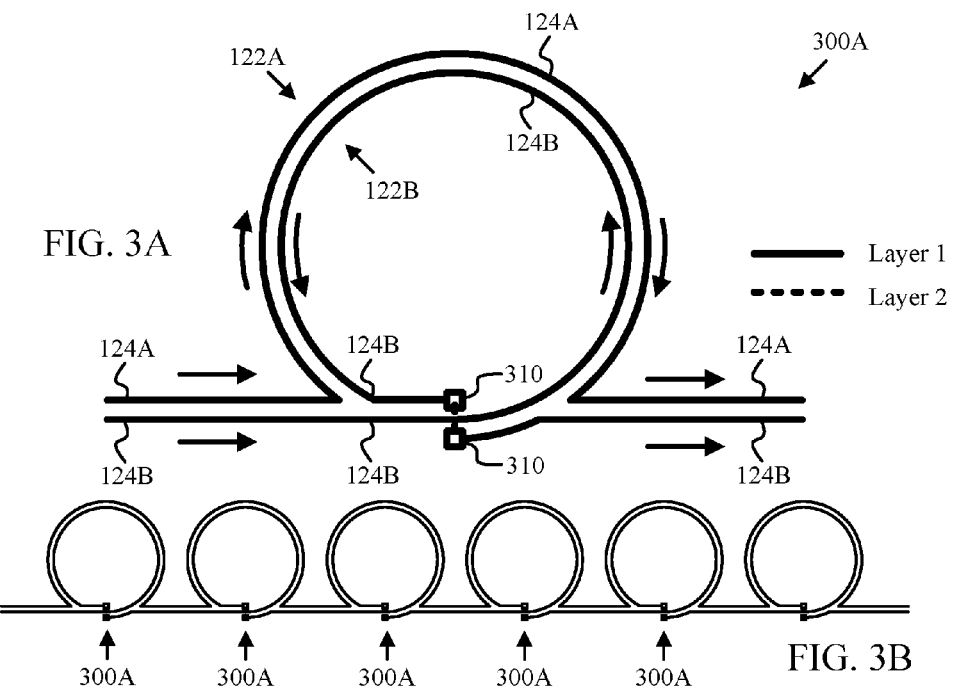
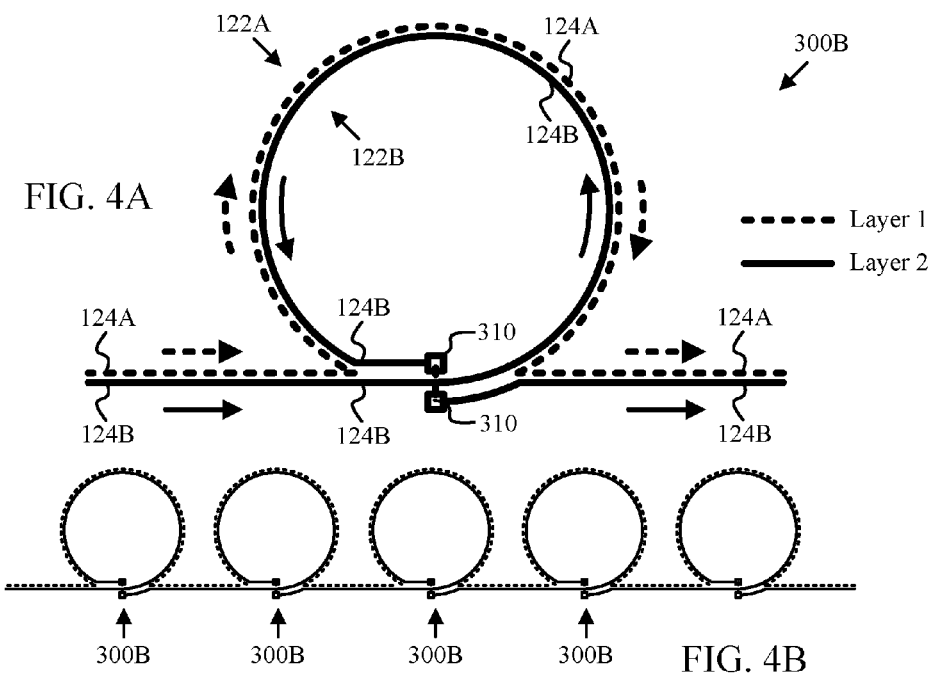

US 9,660,625 B1

CONTINUOUSLY TUNABLE DELAY LINE

BACKGROUND OF THE INVENTION

The present invention relates generally to analog circuits and more particularly to delay lines.

Tunable delay lines provide circuit designers with the ability to control the timing of signals relative to each other. Examples of circuits that use delay lines include clock distribution circuits, timing control circuits, oscillators, phase locked loops, control circuits including antenna array control circuits, reverb circuits, and the like.

SUMMARY

An apparatus includes a first conductive path comprising a first set of inductive elements connected in series, a second conductive path comprising a second set of inductive elements connected in series, each inductive element of the second set of inductive elements inductively coupled to, and having a mutual capacitance with, a corresponding inductive element of the first set of inductive elements. In some embodiments, the apparatus further includes a first amplifier having an amplifier input and an amplifier output, the amplifier output electrically connected to a proximal end of the first conductive path or the second conductive path. The described apparatus delays a signal according to the gain of the input amplifier. A method that uses the described apparatus is also disclosed herein.

BRIEF DESCRIPTION OF THE DRAWINGS

FIGS. 3A and 3B are layout diagrams depicting an example of a coupled inductor delay element in accordance with at least one embodiment of the present invention;

FIGS. 4A and 4B are layout diagrams depicting an example of a coupled inductor delay element in accordance with at least one embodiment of the present invention;

DETAILED DESCRIPTION

The embodiments disclosed herein recognize that tunable delay lines often achieve their tunability by changing the impedance of individual delay elements within the delay line. The embodiments disclosed herein also recognize that the Miller effect can be leveraged to provide a continuously tunable delay line that has a substantially constant characteristic impedance and flat group delay over a wide signal bandwidth.

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

Figure 1:
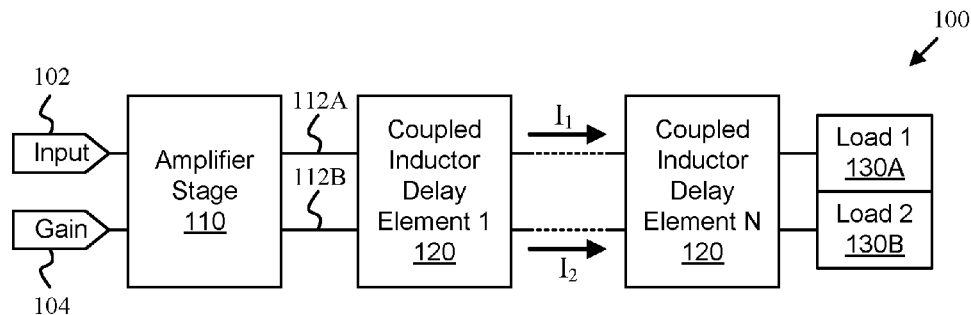
FIG. 1 is a block diagram depicting a tunable delay line in accordance with at least one embodiment of the present invention.

FIG. 1 is a block diagram depicting a tunable delay line 100 in accordance with at least one embodiment of the present invention. As depicted, the tunable delay line 100 includes an amplifier stage 110 that receives an input signal 102 and provides two or more output signals 112. The tunable delay line 100 also includes one or more coupled inductor delay elements 120, and one or more loads 130. The tunable delay line 100 provides a selected delay to an input signal 102 that is continuously tunable based on the gain provided to output signals 112 (e.g., 112A and 112B) by the input amplifier 110.

Figure 2:
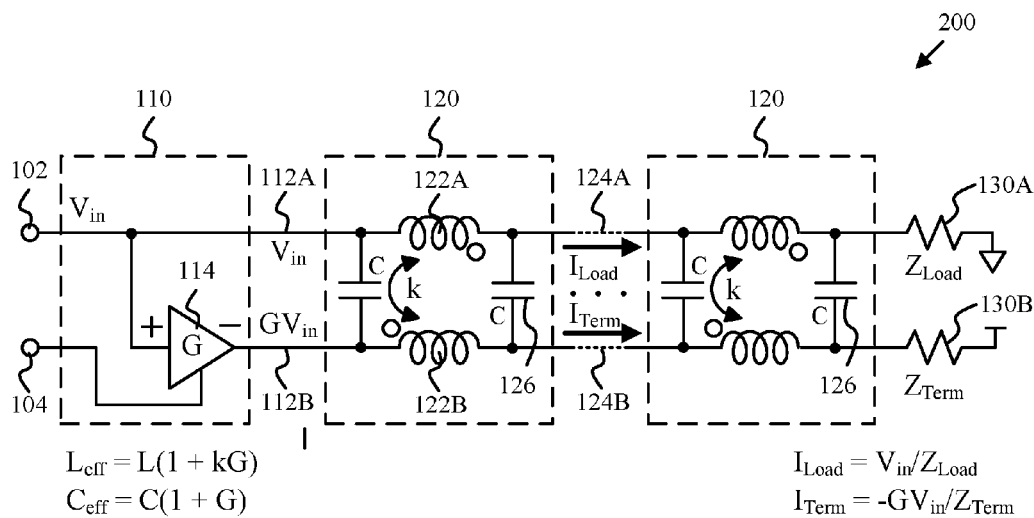
FIG. 2 is a schematic diagram depicting one specific example of the tunable delay line of FIG. 1.

FIG. 2 is a schematic diagram depicting one specific example of the tunable delay line of FIG. 1. FIG. 2 includes additional details that reveal that the coupled inductor delay elements 120 essentially provide two coupled artificial transmission lines. The additional details also reveal how the tunable delay line 100 is able to provide a continuously tunable delay while also maintaining a substantially constant characteristic impedance to the output signals 112 as they propagate to the loads 130A and 130B. In the depicted example, the load 130B is a termination resistor whose resistance is selected to substantially eliminate reflections.

The amplifier stage 110, as depicted in FIG. 2, passes the input signal 102 along as the output signal 112A without gain while passing the input signal 102 along as the output signal 112B with a selected gain G (with inverted polarity) via an amplifier 114. In the depicted embodiment, the amplifier stage 110 also adjusts the gain of the output signal 112B relative to the input signal 102 and the output signal 112A (i.e., G) based on a gain selection signal 104. In other embodiments, the gain of the amplifier stage is tuned via the selection of the circuit elements within the amplifier stage 110. For example, in one embodiment the gain is tuned by selecting the resistance of a degeneration resistor (see FIG. 6) or changing the bias current for amplifier 114 within the amplifier stage 110.

As shown in the equations associated with FIG. 2, the delay for each depicted coupled inductor delay element 120 may be substantially proportional to the square root of the product of (1+G) and (1+kG) where G is the gain provided to the output signal 112B relative to the output signal 112A and k is the inductive coupling constant between individual inductors 122A and 122B within each coupled inductor delay element 120.

The equations associated with FIG. 2 also show that the characteristic impedance $Z_0$ on the first conductive path 124A may be substantially proportional to the square root of the ratio of (1+kG) and (1+G). One of skill in the art will appreciate that providing coupled inductors 122A and 122B that have a inductive coupling constant with a magnitude Ikl that is substantially equal to one (e.g., >=0.9), substantially eliminates the variation in the characteristic impedance $Z_0$ as a function of the amplifier gain –G. For example, in some embodiments the characteristic impedance $Z_0$ of the first conductive path 124A varies less than 10 percent in response to changes in a gain for the amplifier. Furthermore the group delay experienced by signals that propagate along the conductive paths 124 may be substantially flat. For example, the conductive paths 124 may have a substantially flat group delay that varies less than 20 percent over an operative bandwidth of at least one octave.

In the embodiment depicted in FIG. 2, the schematic of each coupled inductor delay element 120 includes one or more shunt capacitors 126 that provide a shunt capacitance C. The shunt capacitance C may be partially or wholly due to the mutual capacitance that is intrinsic to the coupled inductors 122A and 122B. In some embodiments, additional capacitance beyond the intrinsic mutual capacitance is provided by one of more capacitive elements within, or proximate to, each coupled inductor delay element 120.

One of skill in the art will appreciate the tunability of the tunable delay line 100. The number of coupled inductor delay elements 120 may be selected to provide a minimum required delay and the gain of the input amplifier may be adjusted to continuously vary the delay to the desired amount. The range of tunability may correspond to the range of achievable gains for the amplifier 110. For example, in one particular example simulated by the inventors, the range of gains can be varied from 0.25 to 1.4 for an embodiment having the circuit values k=0.8, L=55 pH, and C=20 fF by changing the value of a degeneration resistor for the amplifier 114. In the described example, the delay per coupled inductor delay elements 120 varied from 1.3 ps per stage to 2.36 ps per stage while the characteristic impedance $Z_0$ varied only from 51.3 ohms to 49.2 ohms.

Figure 5A:
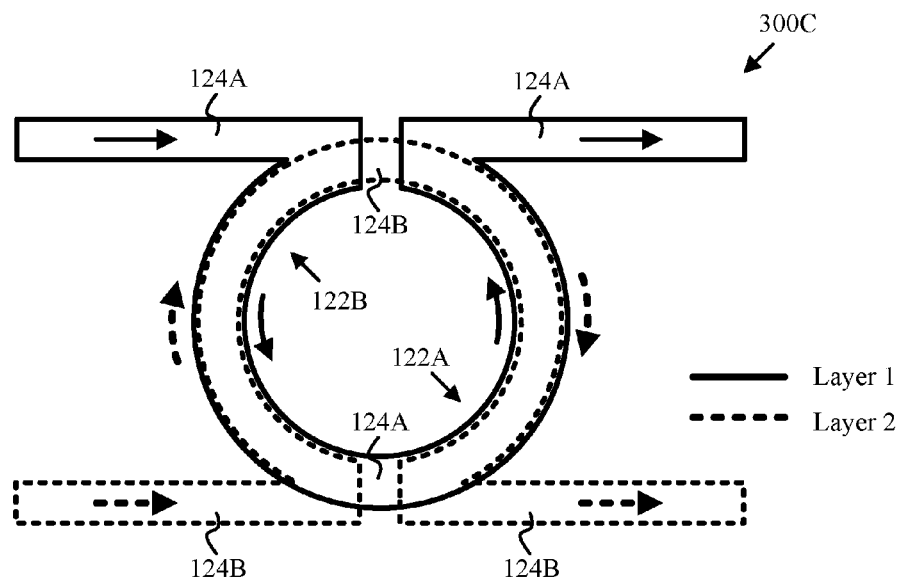
FIGS. 5A and 5B are layout diagrams depicting an example of a coupled inductor delay element in accordance with at least one embodiment of the present invention.

FIGS. 3A, 4A, and 5A are layout diagrams depicting respective various examples of a coupled inductor delay element 300 (i.e., 300A, 300B, and 300C respectively) in accordance with at least one embodiment of the present invention. The various examples 300 may be used, or adapted for use, as the coupled inductor delay element 120 within the delay line 120 or the like.

Figure 5B:
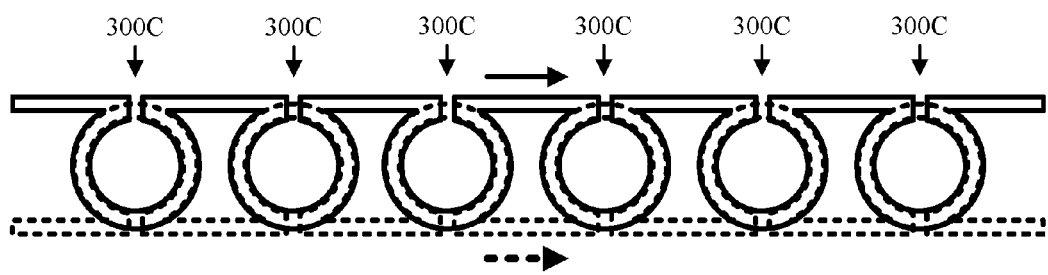

FIGS. 3B, 4B, and 5B are layout diagrams depicting respective various examples of multiple coupled inductor delay elements 300 (i.e., 300A, 300B, and 300C respectively) connected in series as could be done in a delay line. As depicted, each coupled inductor delay element 300 includes conductive paths 124A and 124B that are substantially parallel to each other and are looped to provide coupled inductors 122A and 122B, respectively, with a negative coupling factor.

FIGS. 3A and 3B depict an example (300A) where both conductive paths 124 reside on a first conductive layer (shown as solid lines) with the exception of a (vertical) portion of the conductive path 124B that resides on a second conductive layer (shown as dashed lines) and connects to the first conductive layer through a set of vias 310.

FIGS. 4A and 4B depict an example (300B) where the first conductive path 124A resides on a first conductive layer (shown as dashed lines) and the second conductive path 124B resides on a second conductive layer (shown as solid lines) with the exception of a (vertical) portion of the conductive path 124B that resides on a first conductive layer (shown as dashed lines) and connects to the first conductive layer through a set of vias 310. By restricting the first conductive path to the first conductive layer and the second conductive path primarily to the second conductive layer, the inductors 122A and 122B may partially or completely overlap (from a top or plan view perspective) with the exception of the region near the vias 310. Partially or completely overlapping may increase the magnitude of the inductive coupling factor k to be essentially unity (e.g., >=0.90).

FIGS. 5A and 5B depict an example (300C) where the conductive paths 124 are formed of wide traces and where the first conductive path 124A resides entirely on a first conductive layer (shown as solid lines) and the second conductive path 124B resides entirely on a second conductive layer (shown as dashed lines). Consequently, no vias 310 are required by the coupled inductor delay element 300. Furthermore, the use of wide traces may increase the mutual capacitance between the inductors 122A and 122B and thereby reduce or eliminate the need for separate shunt capacitors within the tunable delay line 100.

Figure 6:
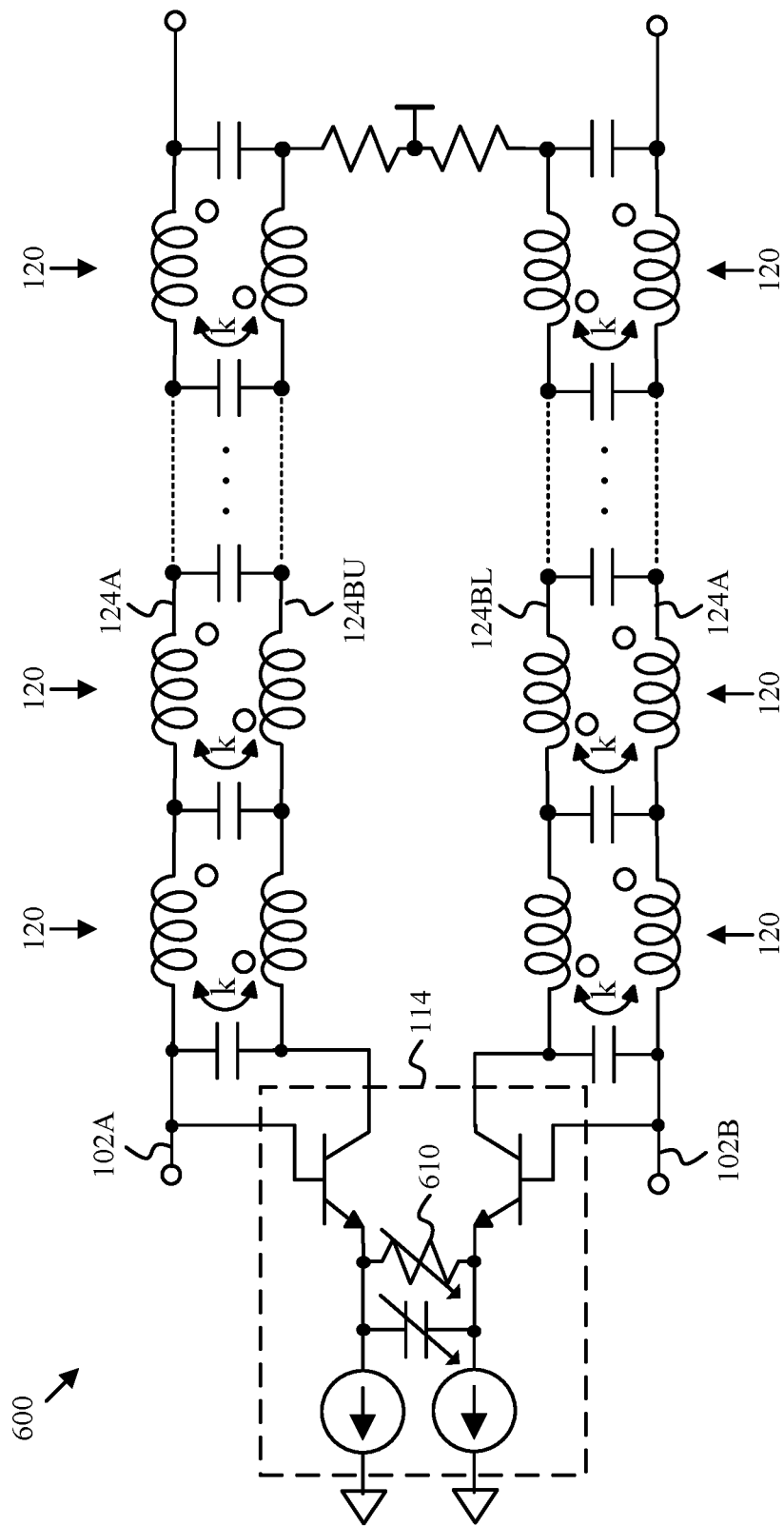
FIG. 6 is a schematic diagram depicting one specific example of a differential delay line in accordance with at least one embodiment of the present invention.

FIG. 6 is a schematic diagram depicting one specific example of a differential delay line 600 in accordance with at least one embodiment of the present invention. In the depicted embodiment, the amplifier 114 is a differential amplifier with differential inputs 102A and 102B. The depicted amplifier 114 is biased with two identical current sources and provides a negative gain for an input signal from 102A to an upper conductive delay path 124BU and a negative gain for an input signal from 102B to the lower conductive delay path 124BL. A tunable degeneration resistor 610 enables tuning of the gain of the amplifier 110. By providing the upper and lower conductive paths 124B and selecting the gain of the amplifier 110, a delay corresponding to the selected gain can be provided to the differential signal applied to the differential inputs 102A and 102B.

Figure 7A:
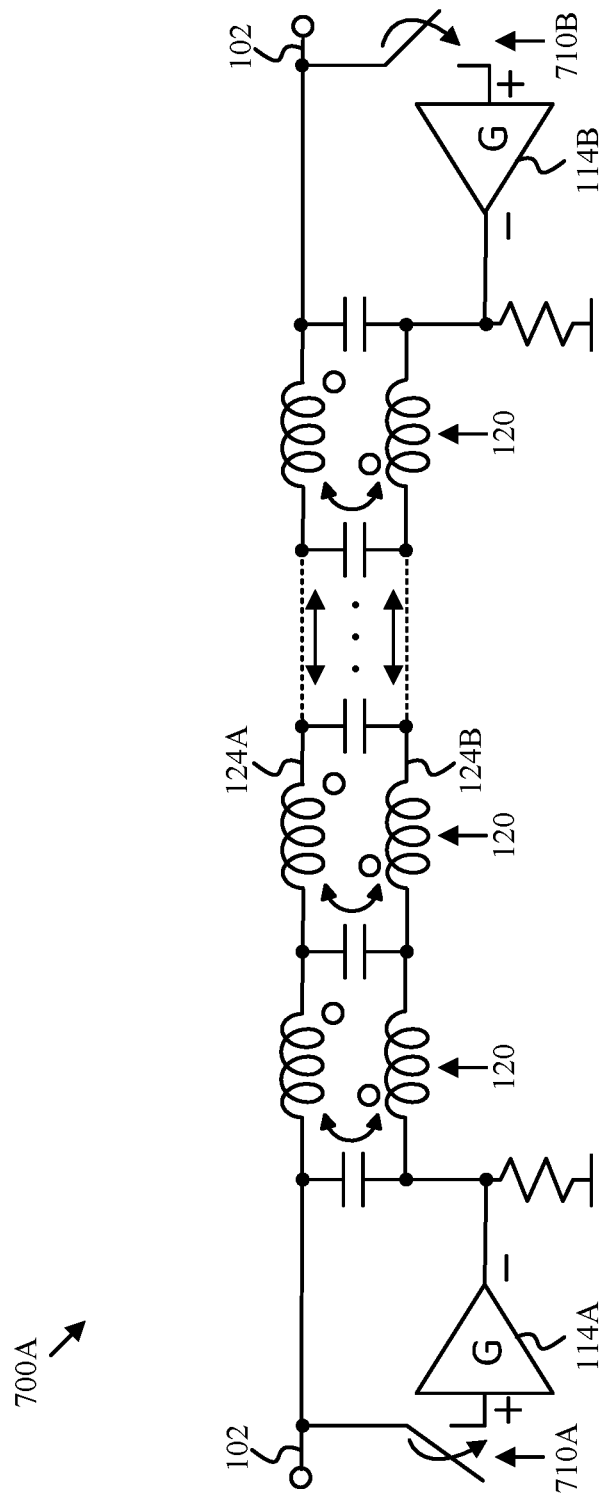
FIGS. 7A and 7B are schematic diagrams depicting two variations of a bidirectional delay line 700 in accordance with various embodiments of the present invention.
Figure 7B:
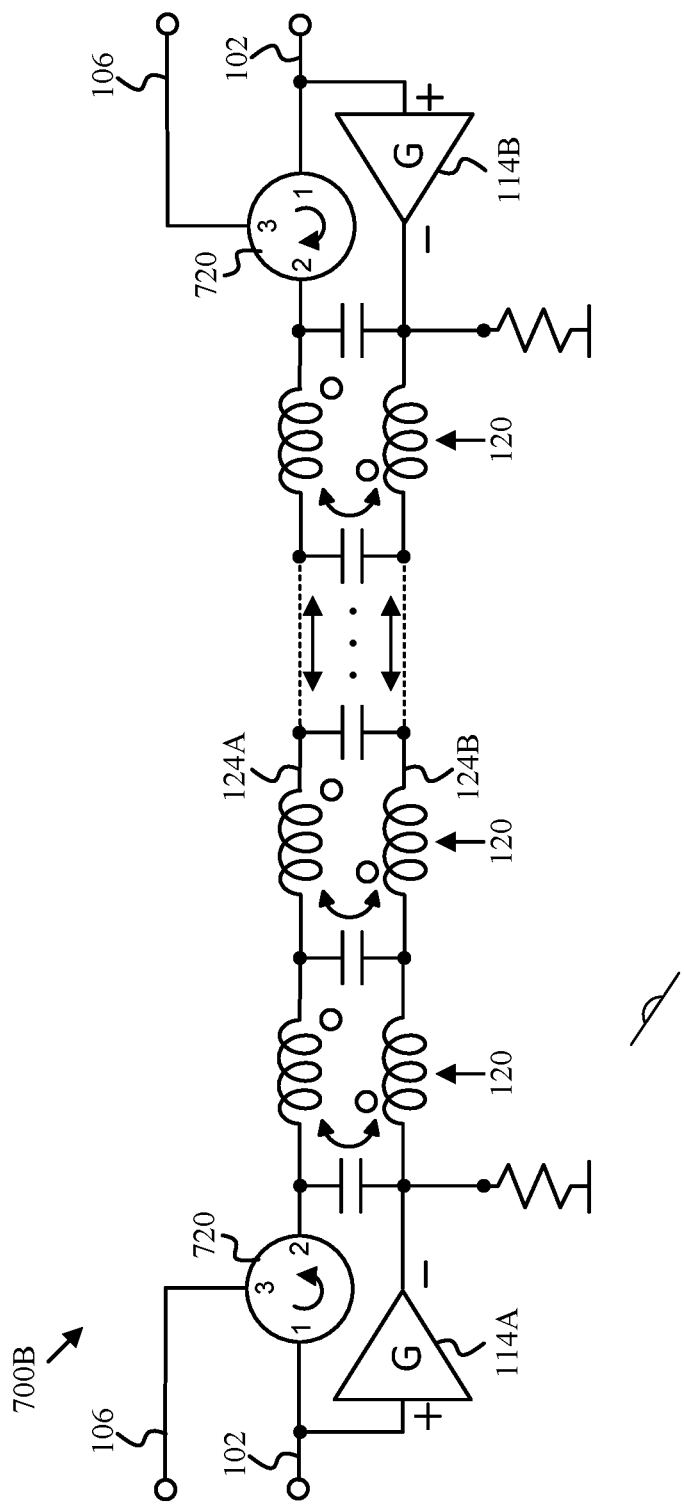

FIGS. 7A and 7B are schematic diagrams depicting two variations of a bidirectional delay line 700 in accordance with various embodiments of the present invention. As depicted, the bidirectional delay lines 700 (i.e., 700A and 700B) include an amplifier 114 placed at each end of the conductive paths 124 (i.e., 114A and 114B). In the depicted example, the delay line 700A is a half-duplex delay line where the conductive path 124B is driven by activating one of the amplifiers 114A or 114B via a switch 710 (i.e., 710A or 710B respectively) or some other means of activation. Additional switches may be added to the inputs 102 so that only one end of the conductive path 124A is provided with an input signal.

One of skill in the art will appreciate that, for some applications, a full duplex version 700B of the delay line as shown in FIG. 7B can be achieved by omitting the switches 710 and adding RF circulators 720 to each end that separate the input signals and the output signals according to their propagation direction. For example, in the depicted embodiment the RF circulators 720 have three (rotationally arranged) non-reciprocal ports where an RF signal that enters ports 1, 2, and 3, will exit ports 2, 3, and 1, respectively. Consequently, an input signal that enters port 1 and exits port 2 may be separated from a output signal traveling in the opposite direction that enters port 2 and exits port 3. As a result, both ends of the delay line 700B redirect the output signal to an output port 106 instead of the input ports 102.

In summary, at least some of the embodiments disclosed herein provide a delay line with a wide range of tunability that has a substantially constant characteristic impedance and flat group delay over a wide signal bandwidth. It should also be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An apparatus comprising:
   a first conductive path comprising a first set of inductive elements connected in series;
   a second conductive path comprising a second set of inductive elements connected in series, each inductive element of the second set of inductive elements inductively coupled to, and having a mutual capacitance with, a corresponding inductive element of the first set of inductive elements; and
   a first amplifier having an amplifier input and an amplifier output, the amplifier output electrically connected to a proximal end of the first conductive path or the second conductive path.

2. The apparatus of claim 1, wherein a magnitude of an inductive coupling factor k between each inductive element of the second set of inductive elements and the corresponding inductive element of the first set of inductive elements is substantially equal to 1.

3. The apparatus of claim 1, wherein the second conductive path is disposed substantially parallel to the first conductive path.

4. The apparatus of claim 1, wherein an impedance seen at the amplifier input varies less than 10 percent in response to changes in a gain for the amplifier.

5. The apparatus of claim 1, further comprising a load electrically connected to a distal end of the first conductive path or the second conductive path.

6. The apparatus of claim 5, wherein a gain for the first amplifier corresponds to a desired signal delay between the amplifier input and the load.

7. The apparatus of claim 1, further comprising a first shunt capacitor disposed between the first conductive path and the second conductive path.

8. The apparatus of claim 1, wherein the first conductive path and the second conductive path have a substantially flat group delay.

9. The apparatus of claim 1, further comprising a second amplifier configured to drive a distal end of the first conductive path or the second conductive path.

10. The apparatus of claim 9, further comprising a first switch for disabling the first amplifier and a second switch for disabling the second amplifier.

11. The apparatus of claim 1, further comprising a third conductive path comprising a third set of inductive elements and a fourth conductive path comprising a fourth set of inductive elements, each inductive element of the fourth set of inductive elements inductively coupled to, and having a mutual capacitance with, a corresponding inductive element of the third set of inductive elements.

12. The apparatus of claim 11, wherein the first amplifier comprises a second amplifier output operably connected to a proximal end of the third conductive path or the fourth conductive path.

13. The apparatus of claim 12, wherein a load is electrically connected to a distal end of the third conductive path or the second conductive path.

14. The apparatus of claim 11, further comprising a second shunt capacitor disposed between the third conductive path and the fourth conductive path.

15. A method comprising:
   providing a first conductive path comprising a first set of inductive elements connected in series;
   providing a second conductive path comprising a second set of inductive elements connected in series, each inductive element of the second set of inductive elements inductively coupled to, and having a mutual capacitance with, a corresponding inductive element of the first set of inductive elements;
   providing an amplifier having an amplifier input and an amplifier output, the amplifier output operably connected to a proximal end of the first conductive path or the second conductive path;
   providing a load electrically connected to a distal end of the first conductive path or the second conductive path; and
   selecting a gain for the amplifier that corresponds to a desired signal delay between the amplifier input and the load.

16. The method of claim 15, wherein a magnitude of an inductive coupling factor k between each inductive element of the second set of inductive elements and the corresponding inductive element of the first set of inductive elements is substantially equal to 1.

17. The method of claim 15, wherein an impedance seen at the amplifier input varies less than 10 percent in response to changes in a gain for the amplifier.

18. The method of claim 15, wherein the first conductive path and the second conductive path have a substantially flat group delay.

19. The method of claim 15, further comprising driving the amplifier input with a signal.

* * * * *